US011641727B2

(12) United States Patent
Norton et al.

(10) Patent No.: US 11,641,727 B2
(45) Date of Patent: May 2, 2023

(54) COOLING SYSTEM FOR AN ELECTRONIC CIRCUIT MODULE

(71) Applicant: HEWLETT PACKARD ENTERPRISE DEVELOPMENT LP, Houston, TX (US)

(72) Inventors: John Norton, Houston, TX (US); Kevin B. Leigh, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 106 days.

(21) Appl. No.: 17/209,482

(22) Filed: Mar. 23, 2021

(65) Prior Publication Data
US 2022/0312637 A1   Sep. 29, 2022

(51) Int. Cl.
*H05K 7/20* (2006.01)
*H05K 1/02* (2006.01)

(52) U.S. Cl.
CPC ....... *H05K 7/20254* (2013.01); *H05K 1/0203* (2013.01); *H05K 7/20272* (2013.01); *H05K 2201/064* (2013.01)

(58) Field of Classification Search
CPC ... H01L 23/473; G06F 1/20; G06F 2200/201; H05K 7/20254; H05K 7/20772; H05K 7/20781; H05K 7/20272; H05K 7/20809; H05K 7/2079; H05K 7/20927; H05K 7/20763; H05K 1/0203; H05K 2201/064
See application file for complete search history.

(56) References Cited

U.S. PATENT DOCUMENTS

| | | | | |
|---|---|---|---|---|
| 4,639,829 | A * | 1/1987 | Ostergren | ........... H01L 23/4006 257/713 |
| 4,989,070 | A * | 1/1991 | Iversen | .................. H01L 23/427 257/E23.098 |
| 5,465,192 | A * | 11/1995 | Yoshikawa | ........... H01L 23/433 257/E23.09 |
| 6,400,012 | B1 | 6/2002 | Miller et al. | |
| 10,575,438 | B1 | 2/2020 | Yatskov et al. | |
| 2003/0067746 | A1* | 4/2003 | Ishimine | ................. H01L 23/42 257/714 |
| 2011/0064621 | A1* | 3/2011 | Francis, Jr. | ............. C01B 13/10 422/186.2 |

(Continued)

FOREIGN PATENT DOCUMENTS

CN   110828401 A   2/2020
DE   102008052145 A1   4/2010

*Primary Examiner* — Adam B Dravininkas
(74) *Attorney, Agent, or Firm* — Hewlett Packard Enterprise Patent Department

(57) ABSTRACT

Examples described herein relate to cooling system for an electronic circuit module. The cooling system includes a frame disposable on the electronic circuit module and comprising a plurality of compartments defined by compartment walls. The cooling system further includes a plurality of cold plates disposed in the plurality of compartments of the frame and in thermal contact with the electronic circuit module, wherein the plurality of cold plates includes one or more passages to allow flow of a coolant there-through to conduct heat away from the electronic circuit module. Further, the one or more cold plates of the plurality cold plates include a guide feature to allow vertical movement of the one or more cold plates in respective compartments.

20 Claims, 8 Drawing Sheets

(56) References Cited

U.S. PATENT DOCUMENTS

| | | | |
|---|---|---|---|
| 2012/0129024 A1* | 5/2012 | Marchio | H01M 10/613 |
| | | | 429/120 |
| 2016/0081197 A1* | 3/2016 | Arvelo | H01L 23/473 |
| | | | 29/832 |
| 2018/0095228 A1* | 4/2018 | Rosenberg | G02B 6/4231 |
| 2022/0142013 A1* | 5/2022 | Zhou | H05K 7/20927 |
| | | | 361/702 |
| 2022/0255160 A1* | 8/2022 | Amante | H01M 10/613 |

* cited by examiner

COOLING SYSTEM FOR AN ELECTRONIC CIRCUIT MODULE

BACKGROUND

Electronic systems generally include one or more circuit assemblies each including one or more electronic circuit modules. An electronic circuit module typically includes several electronic components disposed on a circuit board. These electronic components may generate heat during their operation. In order to minimize any adverse effects of such heat generated by the electronic components, some circuit assemblies include thermal management systems having a cooling system to draw the heat away from the electronic components.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Figure 1:
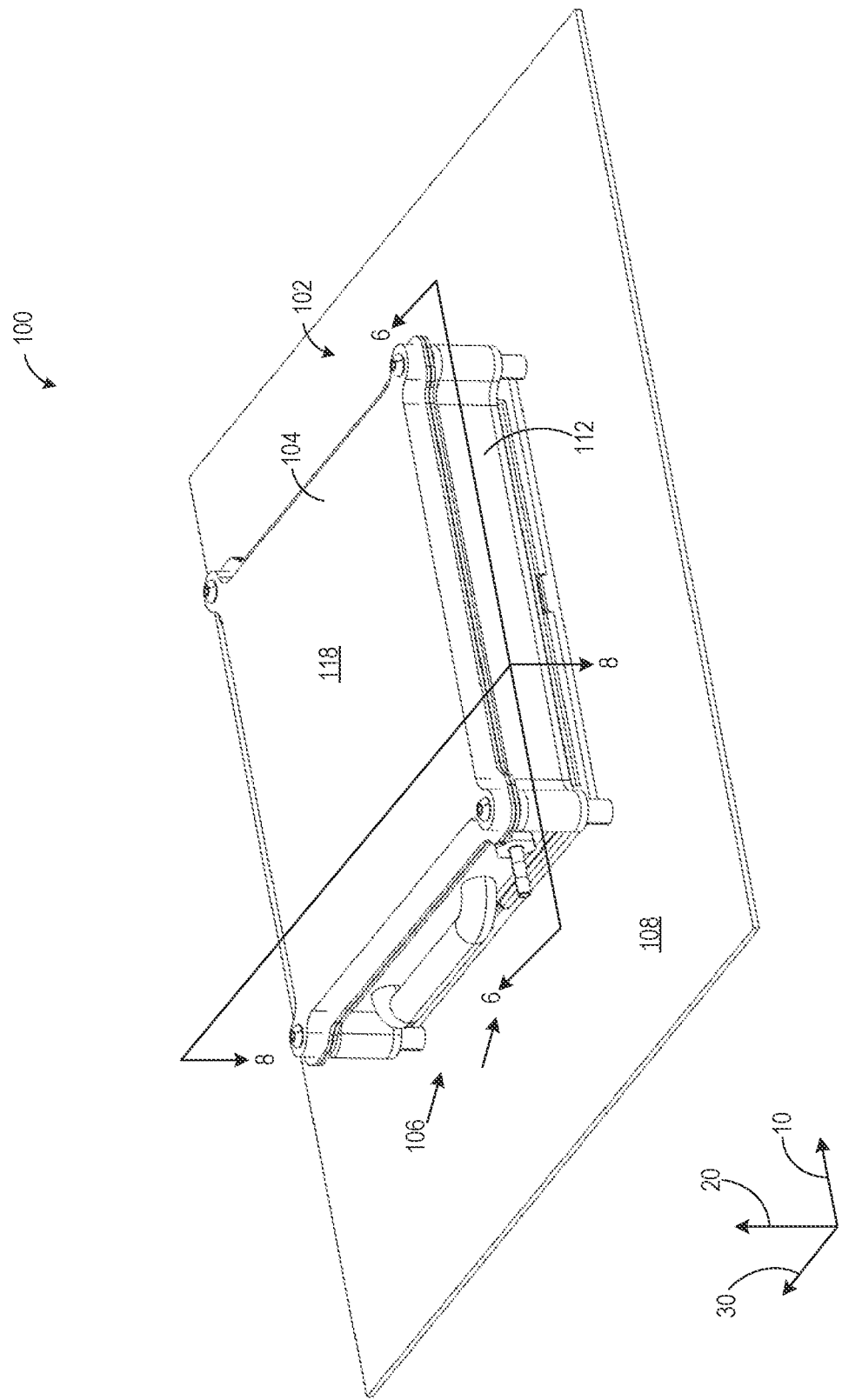
FIG. 1 depicts a perspective view of a circuit assembly having a cooling system, in accordance with an example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, or communicatively linked through a communication channel, pathway, network, or system. Further, the term "and/or" as used herein refers to and encompasses any and all possible combinations of the associated listed items. It will also be understood that, although the terms first, second, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Electronic systems including, but not limited to, computers (stationary or portable), servers, storage systems, wireless access points, network switches, routers, docking stations, printers, or scanners, generally include circuit assemblies including one or more electronic circuit modules. An electronic circuit module typically includes several electronic components disposed on a circuit board, such as, a printed circuit board (PCB). Examples of the electronic components may include, but are not limited to, integrated circuit (IC) chips, power supply chips or modules, electronic devices such as capacitors, inductors, resistors, and the like. During operation, these electronic components may generate heat. As will be understood, such heat generated by the electronic components is unwanted and may impact operation of the electronic components. For example, the heat may cause a physical damage to the electronic components and/or degrade performance of electronic components.

In order to minimize any adverse effects of the heat generated by the electronic components, some circuit assemblies include thermal management systems having a cooling system to draw the heat away from the electronic components generating heat. In some implementations, the cooling system may entail use of one or more heatsinks. The heatsinks may be disposed in thermal contact (e.g., in direct physical contact or via thermally conductive materials) with the electronic components disposed on the PCB. The heatsinks absorb heat generated by the electronic components and transfer the heat away from the electronic components.

In certain designs of the electronic circuit modules, the electronic components may have varying heights resulting in an uneven topology of top surfaces of the electronic components. In some implementations, the IC chips disposed on the PCB may have different heights. Accordingly, top surfaces of the IC chips may be positioned at different heights. In certain other implementations, even though the IC chips disposed on the PCB may have same heights, the top surfaces of the IC chips may be positioned at different heights due to one or more of design tolerances, soldering imperfections, or variations in applied pressures on the IC chips. Consequently, if a common heatsink (or any other cooling medium) is used for several such electronic components, the common heatsink cannot be disposed in contact with top surfaces of all electronic components. In particular, the electronic components with lower heights cannot come in contact with the common heatsink. Accordingly, the cooling system may not effectively perform cooling of the electronic components of the electronic circuit module.

Further, in some implementations, the cooling systems entail use of gap pads. The gap pads may be disposed between the electronic components and the heat sinks to bridge the height differences between the electronic components and the heatsinks. However, the gap pads may have low thermal conductivity resulting in inefficient cooling of the electronic components. The electronic components that remain heated (e.g., not properly cooled) may cause conduction of the heat via the substrate of the PCB. Such conduction of the heat via the substrate of the PCB may cause heating of one or more of the rest of the electronic components, for example, a die-to-die heating of the rest of the IC chips. Further, certain other implementations of the cooling systems may entail use of heatsinks with precision machined surfaces for exact mating with electronic components with varying heights. However, such precision machined heatsinks are very costly to produce and may not be scalable for mass production.

In accordance with the aspects of the present disclosure, an improved cooling system is provided for electronic circuit modules that mitigates one or more challenges noted hereinabove. In some examples, the cooling system presented herein may include a frame disposable on the electronic circuit module. The frame may include a plurality of compartments defined by compartment walls. Further, the cooling system may include a plurality of cold plates disposed in the plurality of compartments of the frame and in thermal contact with the electronic circuit module. In particular, in some examples, the plurality of cold plates may be disposed in thermal contact with the electronic components (e.g., IC chips or other electronic components). The plurality of cold plates may include one or more passages to allow flow of a coolant there-through to conduct heat away from the electronic circuit module.

In some examples, one or more cold plates of the plurality cold plates may include a guide feature to allow vertical movement of the one or more cold plates in respective compartments. In certain examples, one or more of the compartment walls may include a guide slot. The plurality of cold plates may be installed in the frame such that the guide features of the cold plates may be received into respective guide slots formed in the respective compartment walls. Use of the guide features and guide slots aids in retaining the cold plates within the respective compartments while allowing vertical movement of the cold plates. Furthermore, use of multiple individual cold plates and the vertical movement of the cold plates may allow each individual cold plate to be properly seated on a top surface of respective electronic component (e.g., IC chip).

Moreover, in some examples, the proposed cooling system may include a biasing member (e.g., a spring plate) having multiple individual loading springs to individually bias the cold plates toward the respective electronic component causing a thermal contact between the cold plates and respective electronic component. Accordingly, in some examples, the proposed cooling system may enable efficient heat transfer from electronic components irrespective of variations in the heights at which top surfaces of the electronic components located. This is achieved at least partially due to the vertical movement of the cold plates effected via use of one or more of the guide features, guide slots, or the biasing member.

Figure 2:
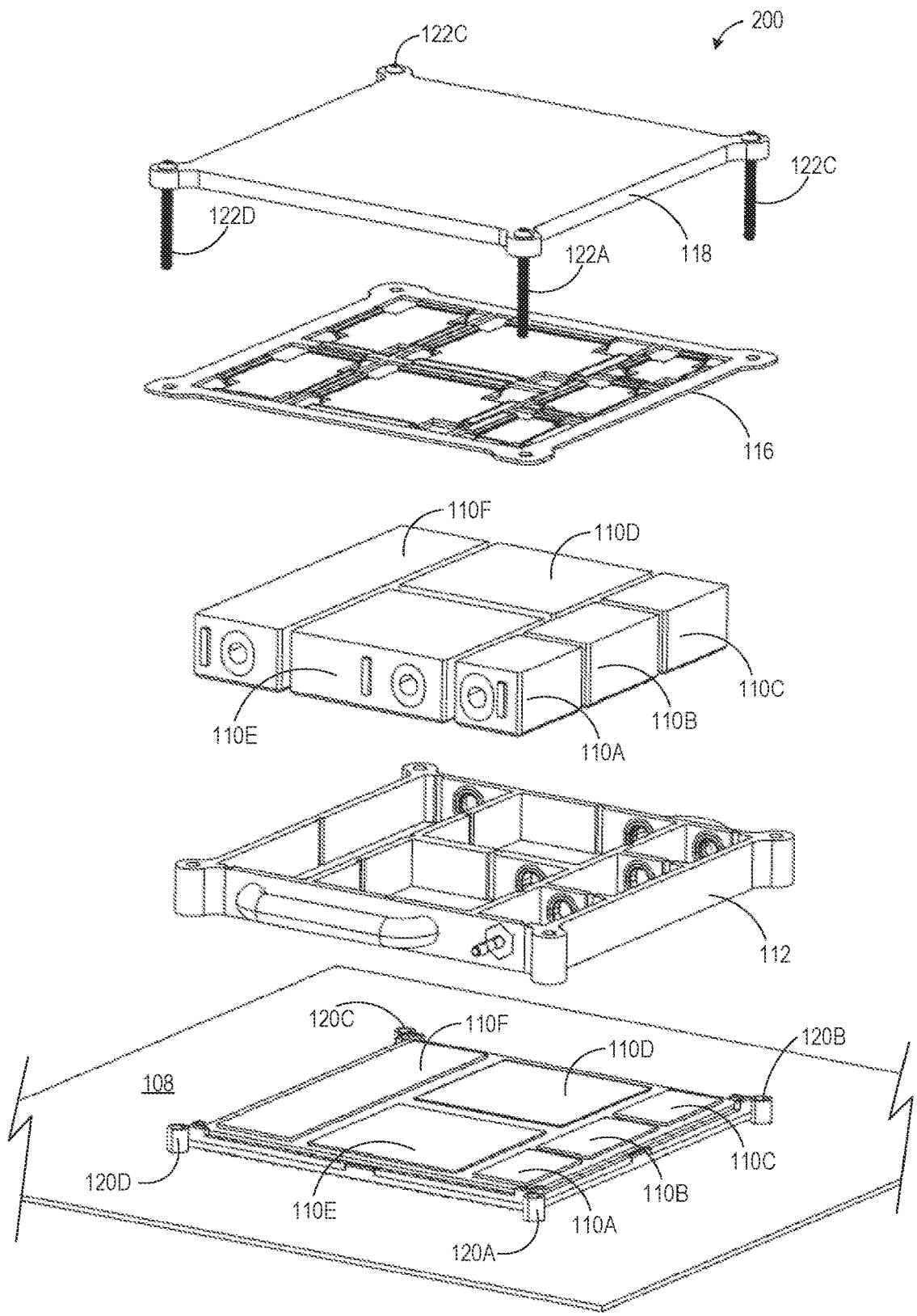
FIG. 2 depicts an exploded view of the circuit assembly of FIG. 1, in accordance with an example.

Referring now to drawings, in FIG. 1, a perspective view 100 of a circuit assembly 102 having a cooling system 104 is presented, in accordance with an example. In the description hereinafter, FIG. 1 is described in conjunction with FIG. 2. FIG. 2 depicts an exploded view 200 of the circuit assembly 102 of FIG. 1, in accordance with an example. FIG. 1 and FIG. 2 are referred concurrently hereinafter. In FIG. 1, reference numerals 10, 20, and 30 represent X-axis, Y-axis, and Z-axis, respectively. The X-axis 10, the Y-axis 20, and the Z-axis 30 are oriented perpendicular to each other.

In some examples, the circuit assembly 102 may be disposed in an electronic system, such as, but not limited to, a computer (stationary or portable), a server, a storage system, a wireless access point, a network switch, a router, a docking station, a printer, a scanner, or any other system that entails use of electronic components. The circuit assembly 102 may include an electronic circuit module 106 (see FIG. 2) and the cooling system 104. The cooling system 104 may be disposed on the electronic circuit module 106 to absorb heat generated by the electronic circuit module 106 and to transfer the heat away from the electronic circuit module 106.

In some examples, the electronic circuit module 106 may include a circuit board 108 and a plurality of electronic components 110A, 110B, 110C, 110D, 110E, and 110F, hereinafter collectively referred to as electronic components 110A-110F. The circuit board 108 may be a printed circuit board (PCB) that includes several electrical conductive traces (not shown) to electrically interconnect one or more of the electronic components 110A-110F. Examples of the electronic components 110A-110F may include, but are not limited to, integrated circuit (IC) chips, power supply chips or modules, electronic devices such as capacitors, inductors, resistors, and the like. In the example implementation of the circuit assembly 102 of FIG. 1, for illustration purposes, the electronic components 110A-110F are shown as being IC chips and the circuit assembly 102 of FIG. 1 may be referred to as a multi-chip module (MCM). Examples of the IC chips that may be hosted on the circuit board 108 may include, but are not limited to, a processor chip (e.g., a CPU chip), a graphics processor chip (e.g., a GPU chip) a microcontroller chip, a memory chip, a power regulator chip, a communication module chip, application-specific integrated circuit (ASIC) chip, a field programmable gate array (FPGA) chip, or any other special purpose chip. It is to be noted that, the electronic circuit module 106 may include various combinations of different types of electronic components, without limiting the scope of the present disclosure. Further, while the electronic circuit module 106 is shown to include six electronic components 110A-110F in FIG. 1 arranged in a specific fashion, the scope of the present disclosure is not limited with respect to the number of electronic components and the manner in which the electronic components are laid out on the circuit board 108.

During operation, these electronic components 110A-110F may generate heat. As will be understood, such heat generated by the electronic components is unwanted and may impact operation of the electronic components 110A-110F if not managed effectively. Also, in some examples, the electronic components 110A-110F may have varying heights resulting in an uneven topology of respective top surfaces. For example, in some implementations, the IC chips disposed on the PCB may have different heights. Accordingly, top surfaces of the IC chips may be positioned at different heights. In certain other implementations, even though the IC chips disposed on the circuit board 108 may have same heights, the top surfaces of the IC chips may be positioned at different heights due to one or more of design tolerances, soldering imperfections, or variations in applied pressures on the IC chips.

In accordance with the aspects of the present disclosure, the cooling system 104 facilitates effective cooling of the electronic components 110A-110F irrespective of variations in the heights of the electronic components 110A-110F. The cooling system 104 may be disposed on the electronic circuit module 106 over the electronic components 110A-110F. Although the circuit assembly 102 of FIG. 1 is shown to include one cooling system 104, use of more than one cooling systems in the circuit assembly 102 is also contemplated within the scope of the present disclosure. The cooling system 104 presented herein is a liquid cooling system that entails use of a liquid coolant (hereinafter referred to as a coolant) to take heat away from the electronic components 110A-110F. For ease of illustration, components and devices (e.g., coolant circulation pumps, valves, etc.) used to enable flow of the coolant are not shown in FIG. 1 and are considered out of the scope of the present disclosure. Additional details of the cooling system are described in conjunction with FIG. 2.

Referring now to FIG. 2, in some examples, the cooling system 104 may include a frame 112, a plurality of cold plates 114A, 114B, 114C, 114D, 114E, and 114F (hereinafter collectively referred to as cold plates 114A-114F), a biasing assembly 116, and a cover 118. The cold plates 114A-114F may be disposed in the frame 112 (see FIG. 3, described later) and the biasing assembly 116 may be disposed on top of the cold plates 114A-114F. Further, the cover 118 may be disposed on top of the biasing assembly 116 and is fastened to mounting posts 120A, 120B, 120C, and 120D (hereinafter collectively referred to as mounting posts 120A-120D) respectively via fasteners (e.g., screws) 122A, 122B, 122C, and 122D (hereinafter collectively referred to as fasteners 122A-122D). The mounting posts 120A-120D may receive respective ones of the fasteners 122A-122D through the biasing assembly 116 and the frame 112 resulting in the cooling system 104 as depicted in an assembled form shown in FIG. 1. Although not shown in FIG. 2, in certain examples, the cooling system 104 may also include one or more buffer frames disposed above and/or below the frame 112 in order to allow certain additional vertical movement to the cold plates 114A-114F. The buffer frames may be added in the cooling system 114 as desired based on variations in the heights of the top surfaces of the electronic components 110A-110F. In some examples, the buffer frames may have lower height in comparison to that of the frame 112. Additional details of the cooling system 104 will be described in conjunction with FIGS. 3-8.

Figure 3:
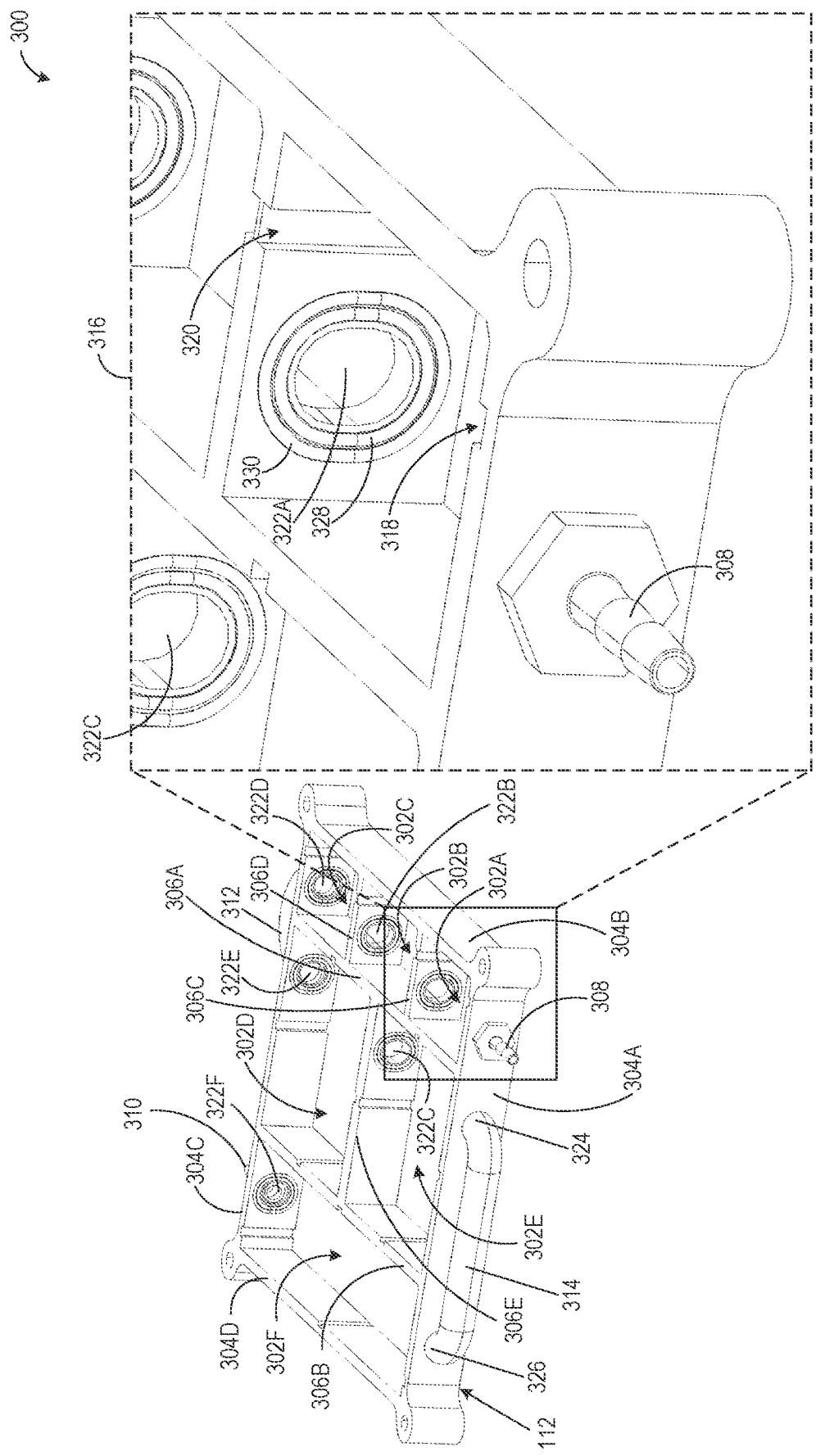
FIG. 3 depicts a perspective view of a frame of the cooling system depicted in FIG. 1, in accordance with an example.
Figure 4:
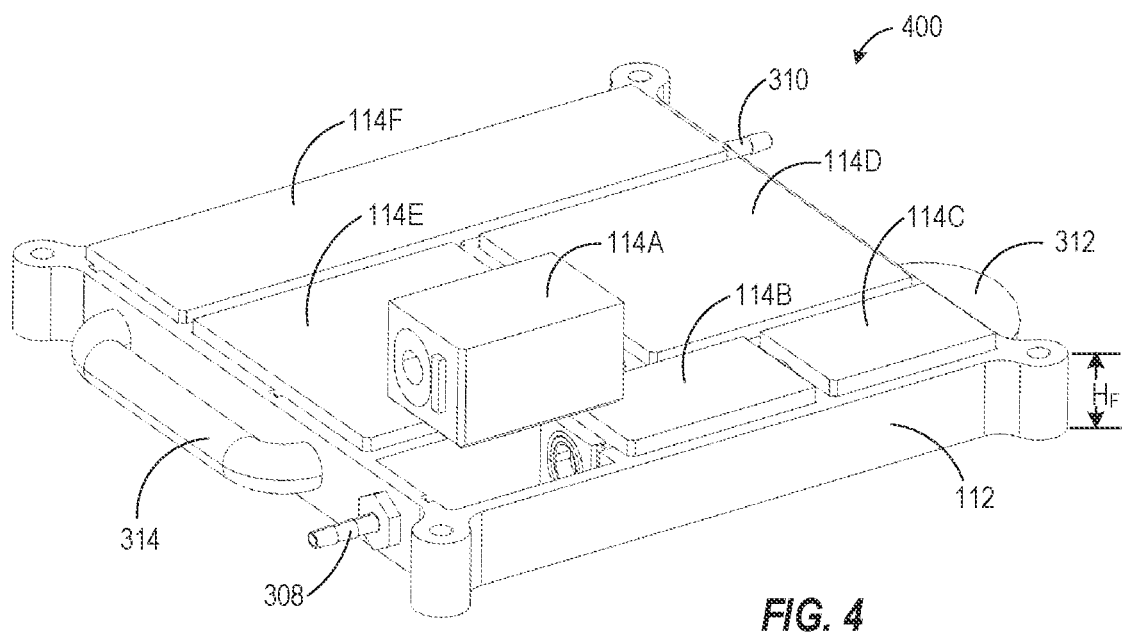
FIG. 4 depicts a perspective view of a portion of the cooling system depicted in FIG. 1, in accordance with an example.
Figure 5A:
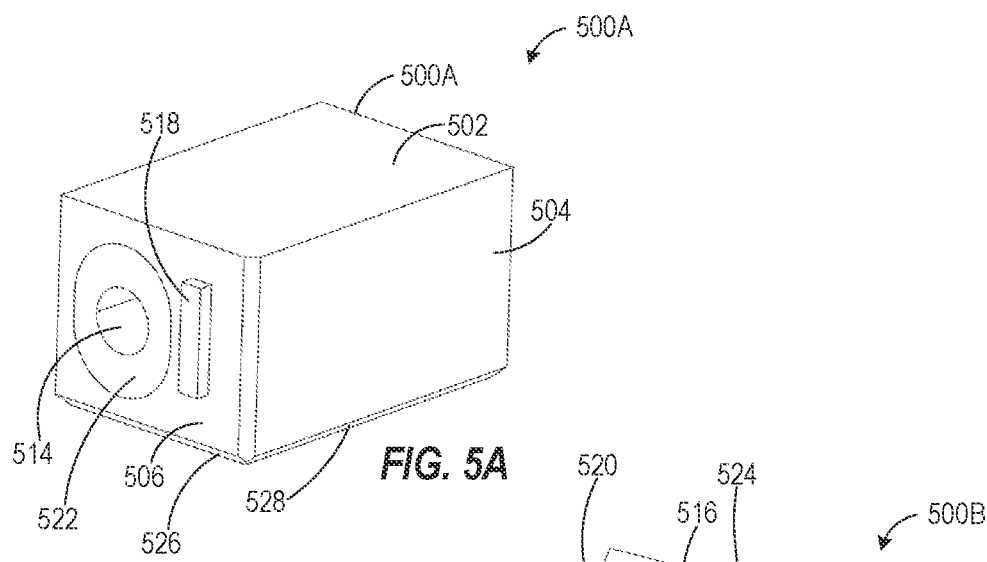
FIG. 5A depicts a perspective view of a cold plate of the cooling system of FIG. 1, in accordance with an example.
Figure 5B:
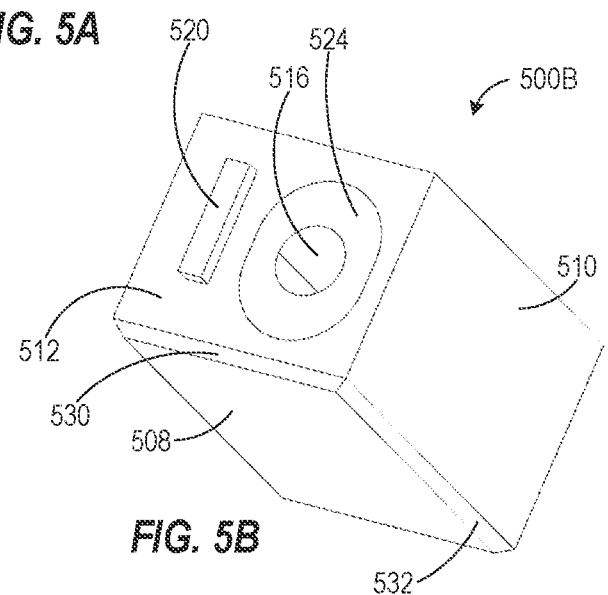
FIG. 5B depicts another perspective view of a cold plate of the cooling system of FIG. 1, in accordance with an example.

In the description hereinafter, FIGS. 3, 4, and 5A-5B will be referenced concurrently. FIG. 3 depicts a perspective view 300 of the frame 112 of the cooling system 104, in accordance with an example. Further, FIG. 4 depicts a perspective view 400 of a portion of the cooling system 104 depicted in FIG. 1, in accordance with an example. Furthermore, FIGS. 5A and 5B depict perspective views 500A and 500B of a cold plate (e.g., a cold plate 114A) of the cooling system 104, in accordance with an example.

Referring now to FIG. 3, in some examples, the frame 112 may include a plurality of compartments, such as, the compartments 302A, 302B, 302C, 302D, 302E, and 302F (hereinafter collectively referred to as compartments 302A-302F). The term compartment as used herein may refer to an empty space surrounded by sidewalls, hereinafter referred to as compartment walls. Each of the compartments 302A-302F may be defined by the respective compartment walls. For example, the frame 112 may include outer walls 304A, 304B, 304C, and 304D and inner walls 306A, 306B, 306C, 306D, 306E each of which is hereinafter referred as compartment wall.

In the example frame 112 depicted in FIG. 3, the outer walls 304A and 304C are located opposite to each other and connected via outer walls 306B and 306D. Further, the inner walls 306A and 306B are spaced apart from each other and extend from the outer wall 304A to 304C. The inner wall 306C extend from the outer wall 304B to the inner wall 306A, thereby forming the compartment 302A. Further, the inner wall 306D is located spaced apart from the inner wall 306A and between the inner wall 306C and the outer wall 304C. In particular, the inner wall 306D may extend from the outer wall 304B to the inner wall 306A, thereby forming the compartments 302B and 302C. Furthermore, the inner wall 306E may extend from the inner wall 306A to the inner wall 306B, thereby forming the compartments 302D and 302E. Moreover, the compartment 302F may be defined as a space surrounded by the outer walls 304A, 304C, 304D, and the inner wall 306B. It is to be noted that, number of compartments, arrangement of the compartments 302A-302F, and positioning and quantity of the inner walls 306A-306E shown in FIG. 3 are for illustration purposes only. The number of compartments, arrangement of the compartments, and positioning and quantity of the inner walls may be custom designed based on layout of electronic components disposed on the circuit board 108, without limiting the scope of the present disclosure.

The plurality of cold plates 114A-114F may be disposed in the plurality of compartments 302A-302F (see FIG. 4) of the frame 112 and in thermal contact with the electronic circuit module 106, in particular, in thermal contact with the electronic components 110A-110F. In the example arrangement shown in FIG. 4, the cold plates 114A, 114B, 114C, 114D, 114E, and 114F may be positioned in the compartments 302A, 302B, 302C, 302D, 302E, and 302F, respectively (for neatness of illustration reference numerals 302A-302F are not marked in FIG. 4).

Referring now to FIGS. 5A and 5B, perspective views of the cold plate 114A are presented. In the description hereinafter, one or more aspects of the cold plate 114A will be described. Other cold plates 114B-114F may also have similar features that are described with reference to the cold plate 114A. Although the cold plate 114A depicted in FIGS. 5A-5B is shown to have rectangular cuboid shape, the cold plate 114A of any other shape may also be employed without limiting the scope of the present disclosure. The cold plate 114A may have sides 502, 504, and 506 (depicted in FIG. 5A) and respective opposite sides 508, 510, and 512 (depicted in FIG. 5B), hereinafter collectively referred to as sides 502-512. The sides 502-512 may define an internal storage space of the cold plate 114A that can hold and/or allow passage of the coolant. In some examples, the cold plate 114A may include one or more passages (see FIG. 6) to allow flow of a coolant there-through to conduct heat away from the electronic circuit module 106. Further, in some examples, the cold plate 114A may include an inlet opening 514 to receive the coolant and an outlet opening 516 to allow exit of the coolant away from the cold plate 114A. Moreover, in some examples, the cold plate 114A may include wall mating portions 522 and 524 surrounding one or both of the inlet opening 514 or the outlet opening 516, respectively. The mating portions 522 and 524 may have an oblong area having machined surface.

Further, in some examples, the one or more cold plates of the plurality cold plates 114A-114F may include a guide feature to allow vertical movement of the one or more cold plates in respective compartments 302A-302F. For example, as depicted in FIGS. 5A-5B, the cold plate 114A may include guide features 518 and 520. It is to be noted that, the present disclosure is not limited with respect the number of guide features that a cold plate can have and positions of such guide features. The term guide feature as used herein may refer to a portion of a cold plate that is extended from or attached to one or more of sides of the cold plate. In some examples, the guide feature such as the guide features 518 and 520 may allow vertical movement of the one or more cold plates (e.g., the cold plate 114A) in respective compartments (e.g., the compartment 302A). The term vertical movement as used herein may refer to a movement (e.g., an upward movement or a downward movement) along a height "HF" of the frame 112.

In some examples, to allow positioning of the cold plates 114A-114F, in some examples, each compartment may include one or more guide slots (see FIG. 3). The term guide slot as used herein may refer to any provision on a compartment wall (internal wall or an external wall) to receive the guide feature of the respective cold plate when the cold plate is disposed in a compartment. For example, one or more of the compartment walls forming a compartment of the plurality of compartment 302A-302F may include one or more guide slots to receive the guide features of a cold plate of the plurality of cold plates 114A-114F. For illustration purposes, one compartment 302A is depicted in an enlarged view 316. Referring now to the enlarged view 316 depicted in FIG. 3, the compartment 302A is shown to include guide slots 318 and 320. The cold plate 114A may be disposed in the compartment 302A such that the guide features 518 and 520 are respectively received into the guide slots 318 and 320. With such positioning of the cold plate 114A, the cold plate 114A may be able to move vertically upward or downward but cannot move in any other direction. Advantageously, use of the guide features 518, 520 and guide slots 318, 320 aids in retaining the cold plates within the respective compartments while allowing vertical movement of the cold plates.

Further, in some examples, the frame 112 may include an inlet 308 to receive the coolant from a coolant source (not shown). The frame 112 may also include an outlet 310 to allow exit of the coolant from the frame 112. Moreover, in some examples, the frame 112 may also include one or more coupling conduits 312, 314 to allow circulation of the coolant from the inlet to the outlet via the plurality of cold plates 114A-114F. The coupling conduits 312, 314 may be formed such that the coupling conduits 312, 314 fluidly couple one or more of the plurality of cold plates 114A-114F from outside of the outer walls 304A-304D. In particular, the coupling conduit 312 is connected between the compartments 302C and 302D and allow flow of the coolant from the cold plate 114C to the cold plate 114D there-through and via the outer wall 304C of the frame 312. Further, the coupling conduit 312 is connected between the compartments 302E and 302F and allow the flow of the coolant from the cold plate 114E to the cold plate 114F there-through and via the outer wall 304A of the frame 312.

Moreover, in some examples, the frame 112 may also provide internal fluid coupling to the cold plates 114A-114F via one or more of the internal walls 306A-306E. The term "fluid coupling" may refer to a connection between two parts that allow a flow of a fluid (e.g., the coolant in this case) from one part to another part. The one or more of the internal walls 306A-306E may include a through-hole to allow a passage of the cooling from one cold plate to an adjacent cold plate there-through. In the example structure of the frame 112 depicted in FIG. 3, the internal walls 306C, 306D, and 306E may respectively include through-holes 322A, 322B, and 322C. The through-hole 322A may allow flow of the coolant from the cold plate 114A to cold plate 114b. Further, the through-hole 322B may allow flow of the coolant from the cold plate 114b to cold plate 114C. Furthermore, the through-hole 322C may allow flow of the coolant from the cold plate 114D to cold plate 114E.

Further, the outer wall 304A may include a through-hole (not visible in FIG. 3) at which the inlet 308 is connected. The through-hole formed (hidden behind the inlet 308) in the wall 304A may allow flow of the coolant from the inlet 308 to the cold plate 114A via the inlet opening 514 of the cold plate 114. Furthermore, in some examples, the outer wall 304A may include additional through-holes (not visible in FIG. 3 as they are hidden behind the coupling conduit 314). In particular, ends 324 and 326 of the coupling conduit 314 are fluidly coupled to these through-holes formed in the outer wall 304A to allow flow of the coolant from the cold plate 114E to cold plate 114F. Moreover, the outer wall 304C may include through-holes 322D, 322E, and 322F formed respectively in the compartments 302C, 302D, and 302F. In particular, the coupling conduit 312 is fluidly coupled between the through-holes 322D and 322E to allow flow of the coolant from the cold plate 114C to cold plate 114D. Further, the outlet 310 may be coupled to the frame 112 at the through-hole 322F to receive the coolant exiting from the cold plate 114F. The through-holes 322A, 322B, 322C, 322D, 322E, 322F and the through-holes formed in the outer wall 304A are hereinafter collectively referred to as frame through-holes.

In some examples, the cold plates 114A-114F may be disposed into respective compartments 302A-302F such that the inlet opening and the outlet opening of the respective cold plates are aligned with the respective through-holes so that a fluid path (see FIG. 6) is established between the inlet 308 and the outlet 310 via the cold plates 114A-114E and the frame through-holes. In particular, as depicted in the enlarged view 316 in FIG. 3, a cold plate such as the cold plate 114A is disposed into the compartment 302A such that the inlet opening 514 is aligned with the through-hole to which the inlet 308 is coupled and the outlet opening 516 is aligned with the through-hole 322A. In some examples, at least some or all of the frame through-holes may have an opening that is shaped to accommodate vertical movements of the respective cold plates 114A-114F without blocking the flow of the coolant from one cold plate to another cold plate. In one example, at least some or all of the frame through-holes may have an oblong opening so that the flow of the coolant may not be blocked even after vertical displacements of one or more of the cold plates 114A-114F.

Additionally, in some examples, to enable a fluid tight coupling between a cold plate and a frame through-hole, the frame 112 may include a seal ring placed around the opening of the frame through-hole. For example, as depicted in the enlarged portion 316 in FIG. 3, a seal ring such as a seal ring 328 may be disposed at the opening of the through-hole 322A. The seal ring 328 may facilitate a fluid tight seal between the through-hole 322A and the cold plate 114A when the cold plate 114A is disposed in the respective compartment 302A. In certain examples, in order to further enhance sealing properties, the additional seal ring, such as, a fail-safe seal ring 330 may be disposed surrounding the seal ring 328 to ensure that a fluid tight seal may continue to be facilitated even when one of the seal rings 328, 330 is broken or loses sealing properties. It may be noted that, one or more such seal rings 328, 300 may be disposed at every opening (e.g., any opening facing the cold plates 114A-114F) of the frame through-holes to facilitate fluid tight coupling between mating surfaces.

In certain examples, in order to avoid any damage to one or more of the seal rings 328, 330 during insertion of the cold plates 114A-114F in the respective compartments 302A-302F, the cold plates 114A-114F may be designed to have smoothened edges. In particular, in some examples, as depicted in FIGS. 5A and 5B, the cold plate 114A is designed to have chamfers 526, 528, 530, and 532 on the bottom side 512 at the edges to minimize chances of damaging/cutting of the seal rings 328, 330 during insertion of the cold plate 114A into the compartment 302A. Moreover, when the cold plate 114A is disposed into the compartment 302A, the mating portions 522 and 524 surrounding the inlet opening 514 and the outlet opening 516 may face the seal rings 528, 530 disposed at the respective openings. The machined surfaces of the mating portions 522 and 524 may provide certain clearance for proper seating of the seal rings 528, 530 while allowing vertical movement of the cold plate 114A.

Figure 6:
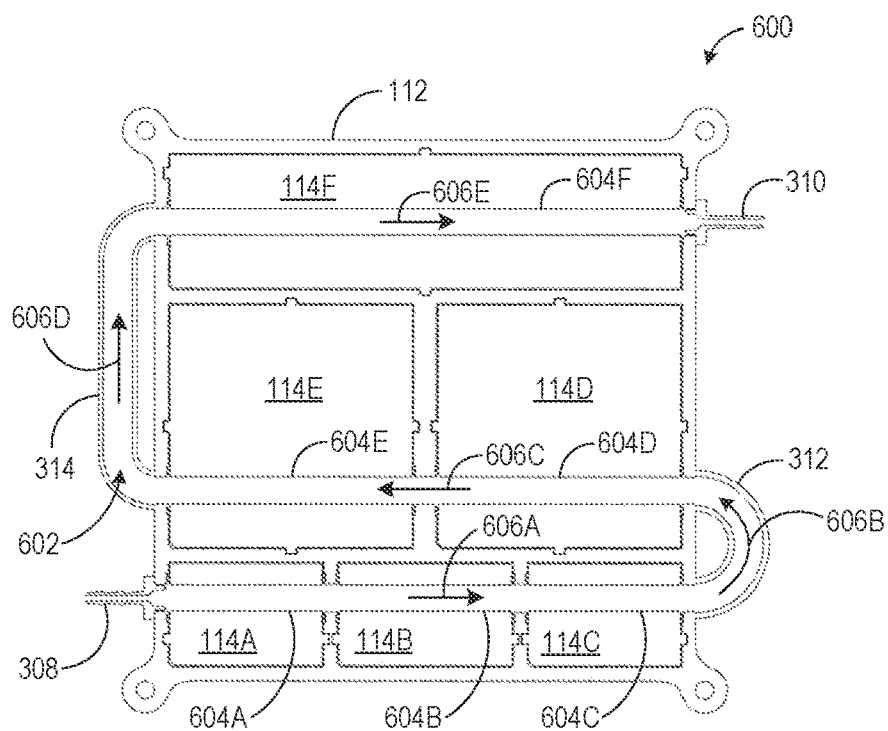
FIG. 6 depicts a first cross-sectional view of the cooling system of FIG. 1, in accordance with an example.

Referring now to FIG. 6, a first cross-sectional view 600 of the cooling system 104 is presented, in accordance with an example. In particular, the first cross-sectional view 600 represents a cross section of the cooling system 104 taken along the Y-axis 20 at location 6-6 depicted in FIG. 1 and when viewed in a direction opposite to a direction indicated on the Y-axis 20 (e.g., when viewed from top). The cross-sectional view 600 is represented to illustrate a fluid path 602 and a coolant flow there-through in the cooling system 104. It is to be noted that for ease illustration, internal features of the cold plates 114A-114F are not depicted in the cross-sectional view 600. In the cross-sectional view 600, coolant passages 604A, 604B, 604C, 604D, 604E, and 604F (hereinafter collectively referred to as coolant passages 604A-604F) formed inside the cold plates 114A, 114B, 114C, 114D, 114E, and 114F, respectively, are depicted. A coolant passage, in a given cold plate (e.g., the cold plate 114A) of the cold plates 114A-114F, may begin at the inlet opening (e.g., the inlet opening 514) and end at the outlet opening (e.g., the inlet opening 516) of the given cold plate.

In some examples, the fluid path 602 may be formed via the coolant passages 604A-604F, the frame through-holes formed in the compartment walls, and the coupling conduits 312, 314. The coolant entering at the inlet 308 may flow through the cold plates 114A-114F in the directions 606A, 606B, 606C, 606D, and 606E. For examples, the coolant entering at the inlet 308 may flow through cold plates 114A, 114B, and 114C via any intermediate frame through-holes in the direction 606A. Further, the coolant may flow from the cold plate 114C to 114D via the coupling conduit 312 in the direction 606B and any intermediate through frame holes. Furthermore, the coolant may flow through cold plates 114D and 114E via any intermediate frame through-holes in the direction 606C. Thereafter, the coolant may flow from the cold plate 114E to 114F via the coupling conduit 314 in the direction 606D and any intermediate through frame holes. As the coolant flows via the fluid path 602, the coolant absorbs heat generated by one or more of the electronic components 110A-110F disposed on the circuit board 108. Finally, the heated coolant may flow from the cold plate 114F to the outlet 310 any intermediate frame through-hole in the direction 606E. The coolant may exit the frame 112 from the outlet 310.

It is to be noted that the present disclosure is not limited with respect to sizes (e.g., a size of an opening allowing ingress or egress of the coolant) of the inlet 308 and/or the outlet 310. The sizes of the inlet 308 and/or the outlet 310 may vary for different applications for desired coolant pressure and flow rate. For illustration purposes, in FIG. 6 and other drawings depicting the inlet 308 and/or the outlet 310, the inlet 308 and the outlet 310 are shown to have smaller size (e.g., smaller diameter/smaller cross section area perpendicular to the direction of the flow of the coolant) than the size of the coolant passages 604A-604F.

Figure 7:
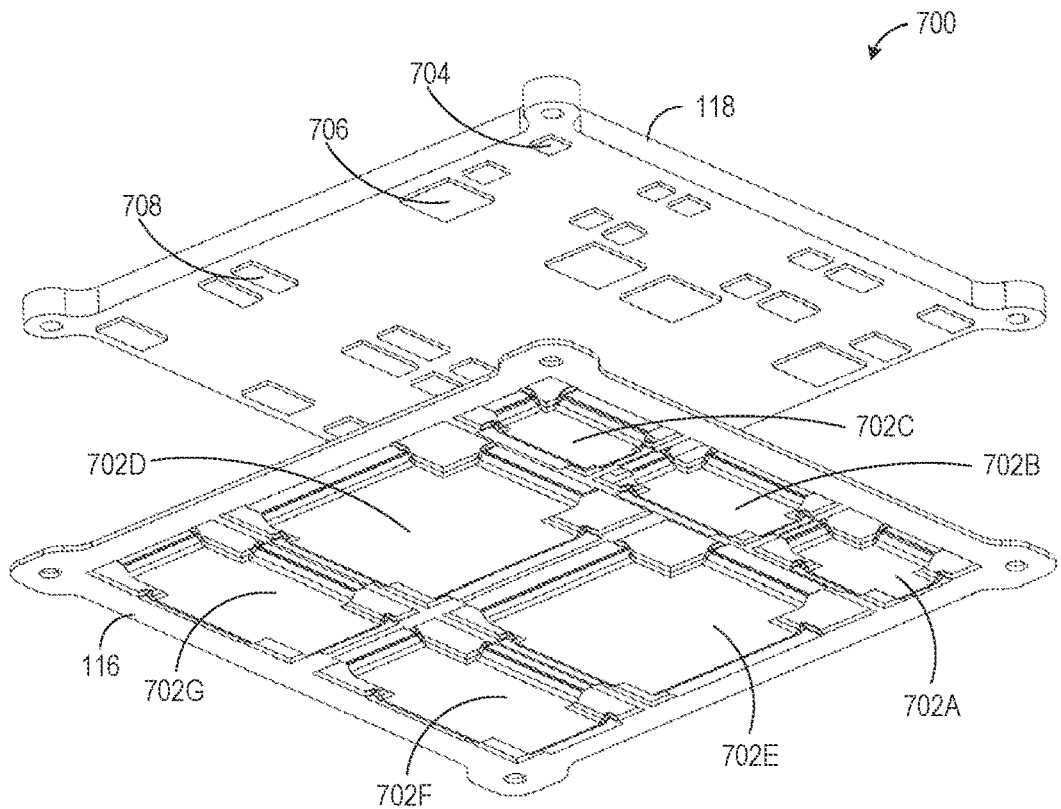
FIG. 7 depicts a perspective view of a portion of a cooling system, in accordance with an example.

Moving now to FIG. 7, an exploded view 700 of a portion of the cooling system 104 is presented, in accordance with an example. In particular, the exploded view 700 depicts the biasing assembly 116 and the cover 118 of the cooling system 104. In the example implementation depicted in FIGS. 2 and 7, the biasing assembly 116 is represented as a spring plate. In some other examples, the biasing assembly 116 may include one or more elastic elements (e.g., a leaf spring, deformable material such as sponge, gel, etc.) disposed between the cold plates 114A-114F and the cover 118 to bias one or more of the plurality of cold plates 114A-114F toward the electronic circuit module 106, more particularly, toward respective electronic components 110A-110F.

In some examples, the biasing assembly 116 may be formed as a spring plate. The spring plate may include a plurality of loading springs 702A, 702B, 702C, 702D, 702E, 702F, 702G (hereinafter collectively referred to as loading springs 702A-702G). The loading springs 702A-702G may represent a metal plate (or any other plate made of flexible material). The biasing assembly 116 when disposed in the cooling system 104, the loading springs 702A, 702B, 702C, 702D, and 702E may be positioned on top of the cold plates 114A, 114B, 114C, 114D, and 114E, respectively. Accordingly, the loading springs 702A, 702B, 702C, 702D, and 702E may individually bias the cold plates 114A, 1146, 114C, 114D, and 114E, respectively, toward respective electronic components 110A-110F disposed on the electronic circuit module 106. In certain examples, the biasing assembly 116 may include a plurality of spring plates to bias a given cold plate. For example, for a large cold plate, such as the cold plate 114F, the biasing assembly may include two (or more) spring plates 702F and 702G to bias the cold plate 114F toward the electronic component 110F. The biasing force applied by the loading springs may cause a thermal contact between the cold plates 114A-114F and the respective electronic components 110A-110F. Accordingly, in some examples, the proposed cooling system 104 may enable efficient heat transfer from electronic components 110A-110F irrespective of variations in the heights at which top surfaces of the electronic components 110A-110F located.

Additionally, in some examples, the cover 118 may include one or more alignment features 704, 706, 708 (only three are marked with reference numerals for illustration purpose) to align the loading springs 702A-702F such that the loading springs 702A, 702B, 702C, 702D, 702E, and 702F may be positioned and retained on top of the cold plates 114A, 114B, 114C, 114D, 114E, and 114F, respectively. The alignment features 704, 706, 708 may be formed as protrusions extending from an inner surface (e.g., a surface facing the biasing assembly 116) of the cover 118. In particular, the alignment features 704, 706, 708 may be engaged with respective one or more alignment openings formed in the biasing assembly 116 thereby limiting dislocation of the loading springs 702A-702F.

Figure 8:
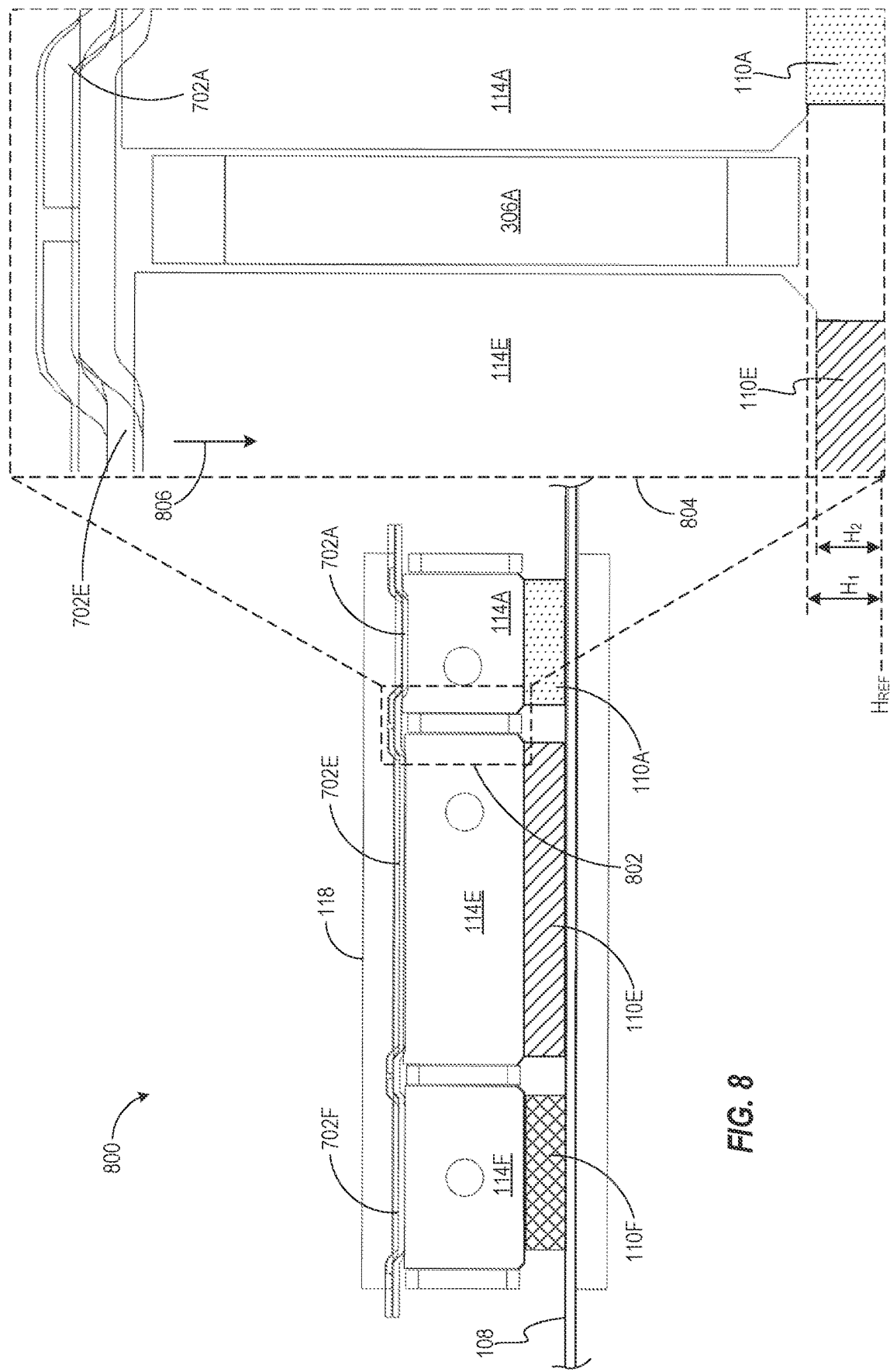
FIG. 8 depicts a second cross-sectional view of the cooling system of FIG. 1, in accordance with an example.

Turning now to FIG. 8, a second cross-sectional view 800 of the cooling system 104 is presented, in accordance with an example. In particular, the second cross-sectional view 800 represents a cross section of the cooling system 104 taken along the X-axis 10 at location 8-8 depicted in FIG. 1 and when viewed in a direction indicated on the X-axis 10. The second cross-sectional view 800 is represented to depict variations in heights of one or more of the electronic components 110A-110F and relative positioning of one or more of the cold plates 114A-114F. In the cross-sectional view 800, the circuit board 108, the electronic components 110A, 110E, and 110F, the cold plates 114A, 114E, and 114F, the biasing member 116, and the cover 118 are depicted in a two-dimensional (2D) view at location 8-8 marked in FIG. 1. It is to be noted that certain components of the circuit assembly 102, including but not limited to, pins of the electronic components 110A-110F and several minute connections, for example, ball-grid arrays are not depicted in the cross-sectional view 800 to avoid complexities in representation. Further, for ease of illustration the cold plates 114A, 114E, and 114F are depicted to have same heights that are shown biased toward the electronic components 110A, 110E, and 110F via the loading springs 702A, 702E, and 702F, respectively.

A region 802 of the cross-sectional view 800 is presented in an enlarged view 804 for illustration purposes. In the enlarged view 804, it is observed that a height ($H_1$) at which a top surface of the electronic component 110A is positioned is higher than a height (Hz) at which a top surface of the electronic component 110E is positioned. For illustration purposes, the heights $H_1$ and $H_2$ are measured with respect to a reference height HREF. Accordingly, the respective cold plates 114A and 114E may be positioned on the top surfaces of the electronic components 110A and 114F at the heights $H_1$ and $H_2$, respectively. The cold plates 114A and 114E may remain biased toward the electronic components 110A and 114, respectively, due to the biasing forces applied by the respective loading springs 702A and 702E in the direction 806.

Figure 9:
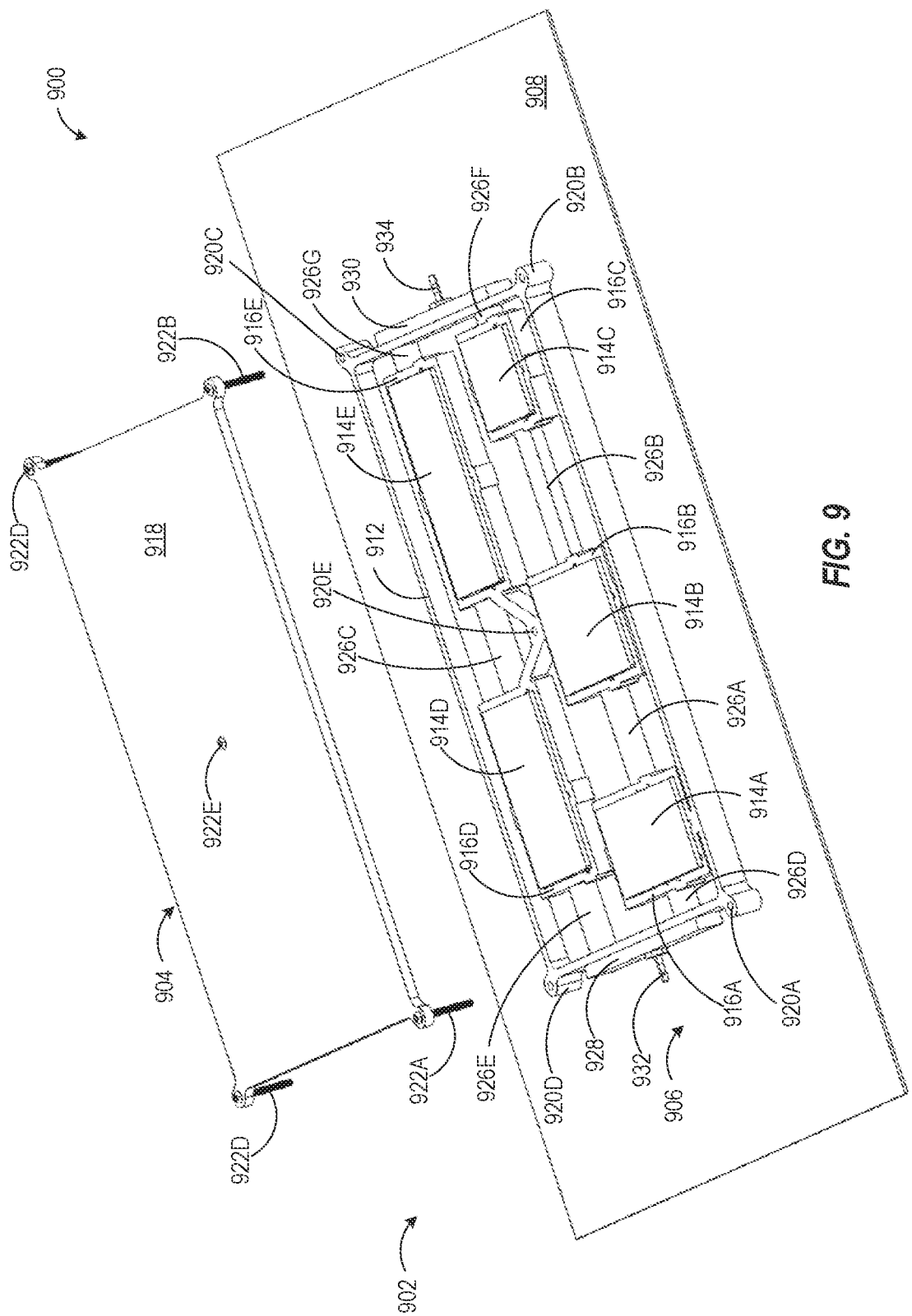
FIG. 9 depicts an exploded view of a circuit assembly including a cooling system, in accordance with another example.

Moving now to FIG. 9, an exploded view 900 of a circuit assembly 902 including a cooling system 904 is presented, in accordance with another example. The circuit assembly 902 may represent one example of the circuit assembly 102 presented in FIG. 1. The circuit assembly 902 may include an electronic circuit module 906 (see FIG. 2) and the cooling system 904. The electronic circuit module 906 may include a circuit board 908 and a plurality of electronic components (not shown, hidden below the cooling system 904). The electronic components of the electronic circuit module 906 may be disposed on the circuit board 908 and are spaced apart from each other with greater distance there-between in comparison to the placement of the electronic components 110A-110F depicted FIG. 1.

The cooling system 904 may be representative of one example of the cooling system 104 of FIG. 1 and include several features that are similar to those described with reference to the cooling system 104. The cooling system 904 may be disposed on the electronic circuit module 906 to absorb heat generated by the electronic circuit module 906 and transfer the heat away from the electronic circuit module 906. In some examples, the cooling system 904 may also include a frame 912, a plurality of cold plates 914A, 914B, 914C, 914D, and 914E (hereinafter collectively referred to as cold plates 914A-914E), a biasing assembly (not shown), and a cover 918. The cold plates 914A-914E may be disposed in the frame 112 in respective compartments 916A-916E. Further, the biasing assembly (not visible) may be disposed on top of the cold plates 916A-916E. Further, the cover 918 may be disposed on top of the biasing assembly and is fastened to mounting posts 920A, 920B, 920C, 920D, and 912E (hereinafter collectively referred to as mounting posts 920A-920E) respectively via fasteners (e.g., screws) 922A, 922B, 922C, 922D, and 922E (hereinafter collectively referred to as fasteners 922A-922E). The mounting posts 920A-920E may receive respective ones of the fasteners 922A-922E through the biasing assembly and the frame 912 resulting in the cooling system 904 in an assembled form.

As depicted in FIG. 9, one or more the compartments 916A-916E are designed to be spaced apart depending on locations of the respective electronic components disposed on the circuit board 908. The compartments 916A-916E may be formed by compartment walls. In the example of FIG. 9, each of the compartments 916A-916E has respective individual/non-shared compartment walls. One or more of the compartment walls forming the compartments 916A-916E may include one or more guide slots (similar to the guide slots 318, 320) and through-holes (similar to the frame through-holes). Further, each of the cold plates 914A-914E may also have one or more guide features (similar to the guide features 518, 520). The cold plates 914A-914E may be disposed in the respective compartments 916A-916E, as depicted in FIG. 9, such that the guide features of the cold plates 914A-914E are received in the guide slots of the respective compartments. Further, inlet openings and outlet openings of the cold plates 914A-914E are aligned with the through-holes formed in the respective compartments 916A-916E.

Further, in some examples, the frame 912 includes an inlet plenum 928 and an outlet plenum 930. The inlet plenum 928 may be coupled to a source of a coolant and receives the coolant via an inlet 932 from the source of the coolant. The outlet plenum 930 may allow exit of the coolant from the frame 912 via an outlet 934. It is to be noted that the present disclosure is not limited with respect to sizes (e.g., a size of an opening allowing ingress or egress of the coolant) of the inlet 932 and/or the outlet 934. The sizes of the inlet 932 and/or the outlet 934 may vary for different applications for desired coolant pressure and flow rate. For illustration purposes, in FIG. 9, the inlet 932 and outlet 934 are shown to have smaller size (e.g., smaller diameter/smaller cross section area perpendicular to the direction of the flow of the coolant) than the size of the coolant passages 604A-604F. Moreover, in certain examples, the frame 912 may include more than one inlets 932 coupled to the inlet plenum 928 to supply the coolant to the inlet plenum 928. Similarly, in some examples, the frame 912 may include more than one outlets 934 coupled to the outlet plenum 930 to allow exit of the coolant from the frame 912.

In some examples, the inlet plenum 928 and the outlet plenum 930 are fluidly coupled to the plurality of the cold plates 914A-914E such that the coolant flows from the inlet plenum 928 to the outlet plenum 930 via the plurality of the cold plates 914A-914E. In particular, in the example configuration of the cooling system 904 shown in FIG. 9, some of the compartments 916A-916E may be fluidly coupled with each other via internal conduits. For example, the compartment 916A is fluidly coupled to the compartment 916B via an internal conduit 926A, Further, the compartment 916B is fluidly coupled to the compartment 916C via an internal conduit 926B. Moreover, the compartment 916D is fluidly coupled to the compartment 916E via an internal conduit 926C. Further, the inlet plenum 928 may be coupled to the compartment 916A via an internal conduit 926D, and to the compartment 916D via an internal conduit 926E. Furthermore, the compartments 916C and the compartments 916E are coupled to the outlet plenum 930 via internal conduits 926F and 926G, respectively. Accordingly, the coolant may be received by the cold plates 914A and 914D from the inlet plenum 928 via the internal conduits 926D and 926E, respectively. Further, the coolant may flow from the cold plate 914A to the outlet plenum 930 via the cold plates 914B, 914C, and the internal conduits 926B, 926F. Similarly, the coolant may flow from the cold plate 914E to the outlet plenum 930 via the cold plates 914E, and the internal conduits 926C, 926G. The coolant may exit from the outlet plenum 930 via the outlet 934.

Figure 10:
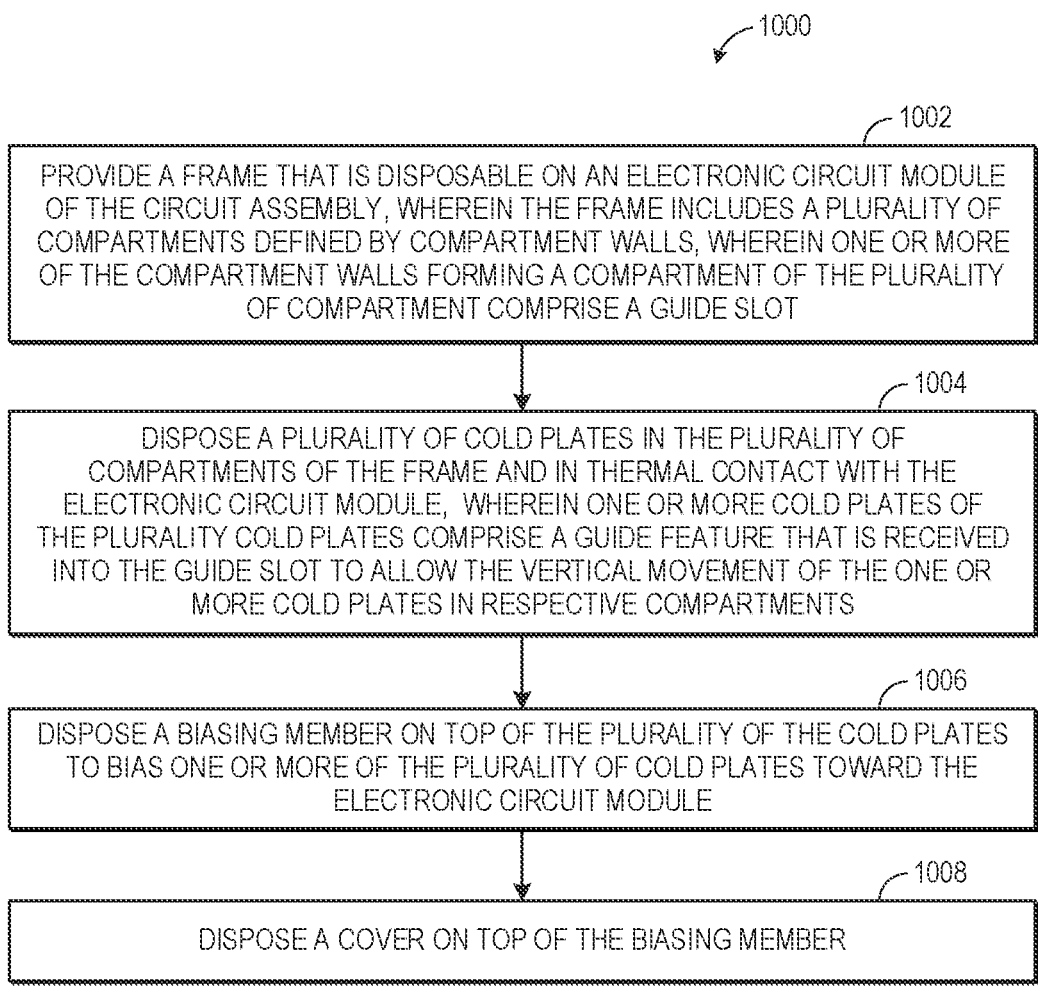
FIG. 10 depicts a flow chart illustrating a method for assembling a cooling system, in accordance with an example.

Moving now to FIG. 10, a flow chart illustrating a method 1000 for assembling a cooling system, such as, cooling system 104 depicted in FIG. 1 is presented, in accordance with an example. In describing the method 1000 of FIG. 10, for illustration purposes, references are made to one or more of FIGS. 1-9. At block 1002, a frame, such as the frame 112, is provided that is disposable on the electronic circuit module 106 of the circuit assembly 102. As previously noted, the frame 112 may include the plurality of compartments 302A-302F defined by compartment walls. One or more of the compartment walls forming a compartment (e.g., the compartment 302A) of the plurality of compartment comprise a guide slot (e.g., the guide slots 318, 320). Further, at block 1004, a plurality of cold plates, such as, the cold plates 114A-114F may be disposed in the plurality of compartments 302A-302F of the frame 112 and in thermal contact with the electronic circuit module 106. The plurality of cold plates 114A-114F may include one or more passages 604A-604F to allow flow of a coolant there-through to conduct heat away from the electronic circuit module 106. Further, one or more cold plates of the plurality cold plates 114A-114F may include a guide feature (e.g., the guide features 518, 520) that is received into the guide slots 318, 320 to allow the vertical movement of the one or more cold plates in respective compartments.

In some examples, one or more of the plurality of compartment walls may include a through-hole (e.g., the frame through holes). One or more seal rings (e.g., the seal rings 328, 330) may be disposed at the opening of the through-hole prior to disposing the plurality of cold plates 114A-114F in the plurality of compartments 302A-302F. The one or more seal rings facilitate a fluid tight seal between the through-hole and a respective cold plate of the plurality of cold plates 114A-114F. Furthermore, at block 1006, a biasing member, such as the biasing member 116, may be disposed on top of the plurality of the cold plates 114A-114F to bias one or more of the plurality of cold plates 114A-114F toward the electronic circuit module 106. Additionally, at block 1008, a cover, such as the cover 118, may be on top of the biasing member 116 resulting in the cooling system 104 in an assembled form as depicted in FIG. 1.

While certain implementations have been shown and described above, various changes in from and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling system for an electronic circuit module, the cooling system comprising:
a frame disposable on the electronic circuit module and comprising a plurality of compartments defined by compartment walls; and
a plurality of cold plates disposed in the plurality of compartments of the frame and in thermal contact with the electronic circuit module, wherein the plurality of cold plates comprises one or more passages to allow flow of a coolant there-through to conduct heat away from the electronic circuit module, and wherein one or more cold plates of the plurality of cold plates are vertically movable relative to the frame and comprise respective guide features to guide vertical movement of the one or more cold plates relative to the frame in respective compartments of the plurality of compartments,
wherein the vertical movement comprises movement toward or away from the electronic circuit module in a state of the frame disposed on the electronic circuit module.

2. The cooling system of claim 1, wherein one or more of the compartment walls forming a compartment of the plurality of compartments comprise a guide slot to receive the guide features of a cold plate of the plurality of cold plates disposed in the compartment, and wherein the guide slot guides allows the vertical movement of the cold plate.

3. The cooling system of claim 2, wherein one or more of the compartment walls comprise a through-hole, and wherein the cold plate comprises an inlet opening to receive the coolant and an outlet opening to allow exit of the coolant away from the cold plate, and wherein the cold plate is disposed into the compartment such that one or more of the inlet opening and the outlet opening are aligned with the through-hole.

4. The cooling system of claim 3, wherein the frame further comprises a seal ring disposed at an opening of the through-hole, wherein the seal ring facilitates a fluid tight seal between the through-hole and the cold plate when the cold plate is disposed in a respective compartment.

5. The cooling system of claim 1, wherein the frame comprises:
an inlet to receive the coolant;
an outlet to allow exit of the coolant from the frame; and
one or more coupling conduits to allow circulation of the coolant from the inlet to the outlet via the plurality of cold plates.

6. The cooling system of claim 1, wherein the frame further comprises:
an inlet plenum to receive the coolant; and
an outlet plenum to allow exit of the coolant from the frame,
wherein the inlet plenum and the outlet plenum are fluidly coupled to the plurality of cold plates such that the coolant flows from the inlet plenum to the outlet plenum via the plurality of cold plates.

7. The cooling system of claim 1, further comprising:
a cover; and a biasing assembly disposed between cover and the plurality of cold plates to bias one or more of the plurality of cold plates toward the electronic circuit module.

8. The cooling system of claim 7, wherein the biasing assembly comprises a spring plate comprising a plurality of loading springs to individually bias one or more of the plurality of cold plates toward respective electronic components disposed on the electronic circuit module.

9. A circuit assembly, comprising:
an electronic circuit module comprising a plurality of electronic components disposed on a circuit board such that top surfaces of the plurality of electronic components are positioned at varying heights; and
a cooling system disposed on the electronic circuit module, the cooling system comprising:
a frame comprising a plurality of compartments defined by compartment walls; and
a plurality of cold plates disposed in the plurality of compartments of the frame and in thermal contact with the one or more of the plurality of electronic components, wherein the plurality of cold plates comprises one or more passages to allow flow of a coolant there-through to conduct heat away from the electronic circuit module, and wherein one or more cold plates of the plurality of cold plates are vertically movable relative to the frame and comprise respective guide features to guide vertical movement of the one or more cold plates relative to the frame in respective compartments of the plurality of compartments so that the one or more cold plates are seated at varying heights on the top surfaces of respective ones of the plurality of electronic components,
wherein the vertical movement comprises movement toward or away from the electronic circuit module in a state of the frame disposed on the electronic circuit module.

10. The circuit assembly of claim 9, wherein one or more of the compartment walls forming a compartment of the plurality of compartments comprise a guide slot to receive the guide features of a cold plate of the plurality of cold plates disposed in the compartment, and wherein the guide slot the vertical movement of the cold plate.

11. The circuit assembly of claim 10, wherein one or more of the compartment walls comprise a through-hole having an oblong opening, wherein the cold plate is disposed into the compartment such that one or more of an inlet opening and an outlet opening of the cold plate are aligned with the through-hole.

12. The circuit assembly of claim 9, wherein the frame further comprises:
an inlet plenum to receive the coolant; and
an outlet plenum to allow exit of the coolant from the frame,
wherein the inlet plenum and the outlet plenum are fluidly coupled to the plurality of cold plates such that the coolant flows from the inlet plenum to the outlet plenum via the plurality of cold plates.

13. The circuit assembly of claim 9, wherein the frame further comprises:

an inlet to receive the coolant;
an outlet to allow exit of the coolant from the frame; and
one or more coupling conduits to allow circulation of the coolant from the inlet to the outlet via the plurality of cold plates.

14. The circuit assembly of claim 9, further comprising:
a cover; and
a biasing assembly disposed between cover and the plurality of cold plates to bias one or more of the plurality of cold plates toward the electronic circuit module, wherein the biasing assembly comprises a spring plate comprising a plurality of loading springs to individually bias one or more of the plurality of cold plates toward respective electronic components disposed on the electronic circuit module.

15. A method of assembling a cooling system of a circuit assembly, the method comprising:
providing a frame that is disposable on an electronic circuit module of the circuit assembly and comprising a plurality of compartments defined by compartment walls, wherein one or more of the compartment walls forming a compartment of the plurality of compartments comprise a guide slot; and
disposing a plurality of cold plates in the plurality of compartments of the frame and in thermal contact with the electronic circuit module, wherein the plurality of cold plates comprises one or more passages to allow flow of a coolant there-through to conduct heat away from the electronic circuit module, and wherein one or more cold plates of the plurality of cold plates are vertically movable relative to the frame and comprise respective guide features that are received into respective guide slots to guide vertical movement of the one or more cold plates relative to the frame in respective compartments of the plurality of compartments,
wherein the vertical movement comprises movement toward or away from the electronic circuit module in a state of the frame disposed on the electronic circuit module.

16. The method of claim 15, wherein one or more of the compartment walls comprise a through-hole, wherein the method further comprises disposing a seal ring at an opening of the through-hole prior to disposing the plurality of cold plates in the plurality of compartments, wherein the seal ring facilitates a fluid tight seal between the through-hole and a respective cold plate of the plurality of cold plates.

17. The method of claim 15, further comprising disposing a biasing member on top of the plurality of cold plates to bias one or more of the plurality of cold plates toward the electronic circuit module.

18. The method of claim 17, further comprising disposing a cover on top of the biasing member.

19. The cooling system of claim 1, wherein the guide features comprises a portion of the one or more cold plates that is extended from or attached to the one or more cold plates.

20. The cooling system of claim 1, wherein the plurality of cold plates are vertically moveable relative to the frame independently of one another.

* * * * *